(12) United States Patent
Heid

(10) Patent No.: US 6,539,246 B2
(45) Date of Patent: Mar. 25, 2003

(54) METHOD AND APPARATUS FOR CONDUCTING AN FMRI-BOLD EXPERIMENT WITH MULTIPLE STIMULATION FUNCTIONS

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 51 days.

(21) Appl. No.: 09/861,347

(22) Filed: May 18, 2001

(65) Prior Publication Data

US 2002/0045814 A1 Apr. 18, 2002

(30) Foreign Application Priority Data

May 18, 2000 (DE) .......................................... 100 24 488

(51) Int. Cl.⁷ .............................................. A61B 5/055
(52) U.S. Cl. ...................................................... 600/410
(58) Field of Search ................................ 600/410, 411, 600/418, 407, 427; 324/307, 309, 318, 324

(56) References Cited

U.S. PATENT DOCUMENTS

| | | | |
|---|---|---|---|
| 5,603,322 A | * 2/1997 | Jesmanowicz et al. | ...... 600/410 |
| 5,662,112 A | 9/1997 | Heid | |
| 6,002,254 A | * 12/1999 | Kassai et al. | ............... 324/306 |
| 6,104,943 A | * 8/2000 | Frederick et al. | ........... 600/410 |
| 6,169,403 B1 | * 1/2001 | Hebrank et al. | ............ 324/318 |
| 6,298,258 B1 | * 10/2001 | Heid et al. | ................... 600/410 |
| 2002/0022778 A1 | * 2/2002 | Wiese et al. | ................ 600/410 |
| 2002/0107440 A1 | * 8/2002 | Brand et al. | ................ 600/410 |
| 2002/0107442 A1 | * 8/2002 | Schreck | ....................... 600/411 |

* cited by examiner

Primary Examiner—Marvin M. Lateef
Assistant Examiner—Eleni Mantis Merlader
(74) Attorney, Agent, or Firm—Schiff Hardin & Waite

(57) ABSTRACT

In a method and an apparatus for the time-resolved and location-resolved representation of functional brain activities of a living subject by nuclear magnetic resonance, physiological processes are stimulated with at least two non-correlating stimulation functions that are orthogonal to one another. A cross correlation of the nuclear magnetic resonance signals with the stimulation functions or with a correlation function that is orthogonal to the stimulation functions serves the purpose of detecting activity changes in the life form, which are based on the respective stimulation function, or, for detecting activity changes that are based on nonlinear coupling of the at least two stimulation functions.

25 Claims, 3 Drawing Sheets

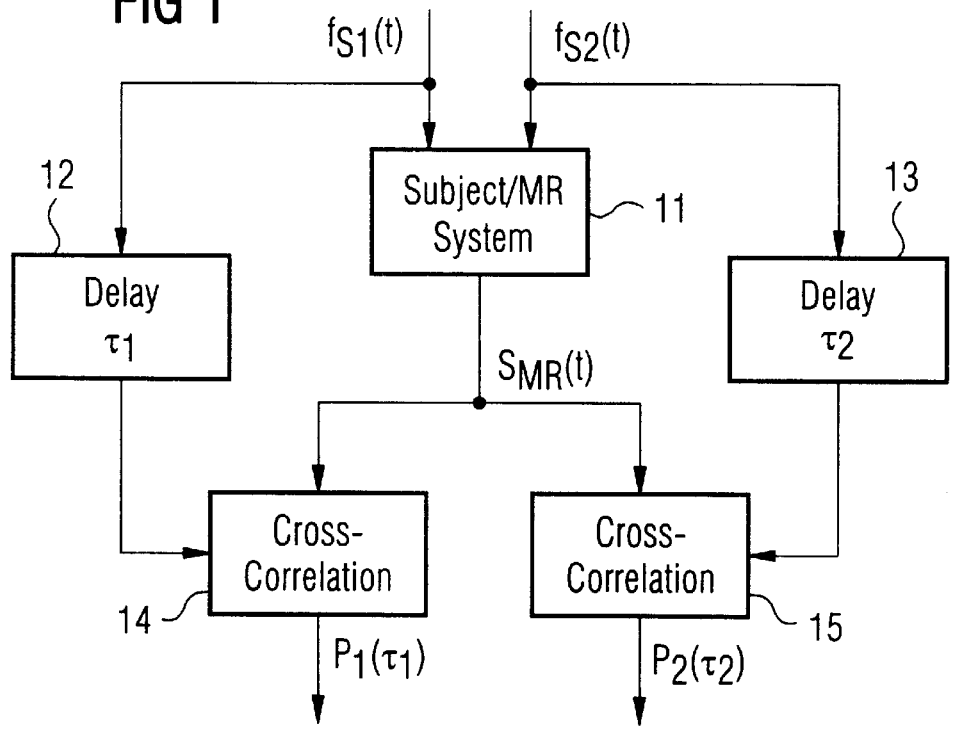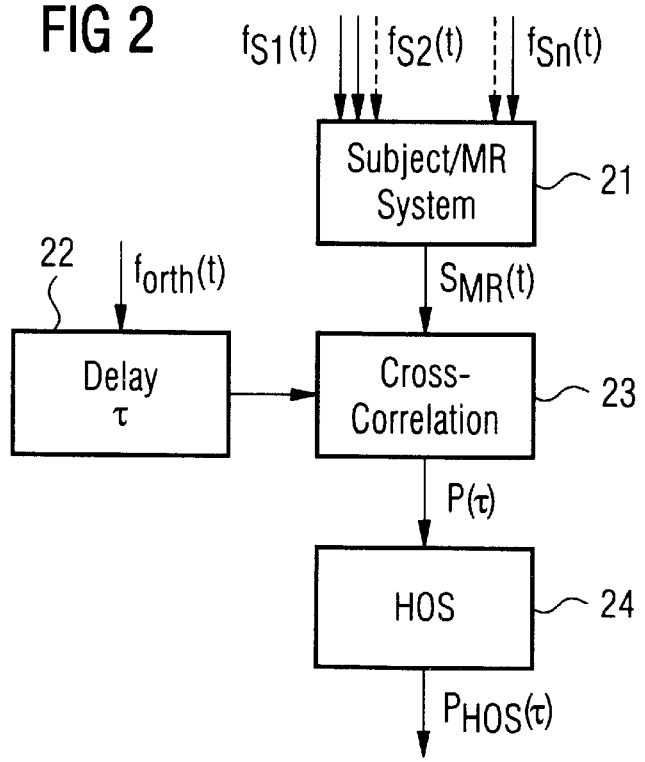

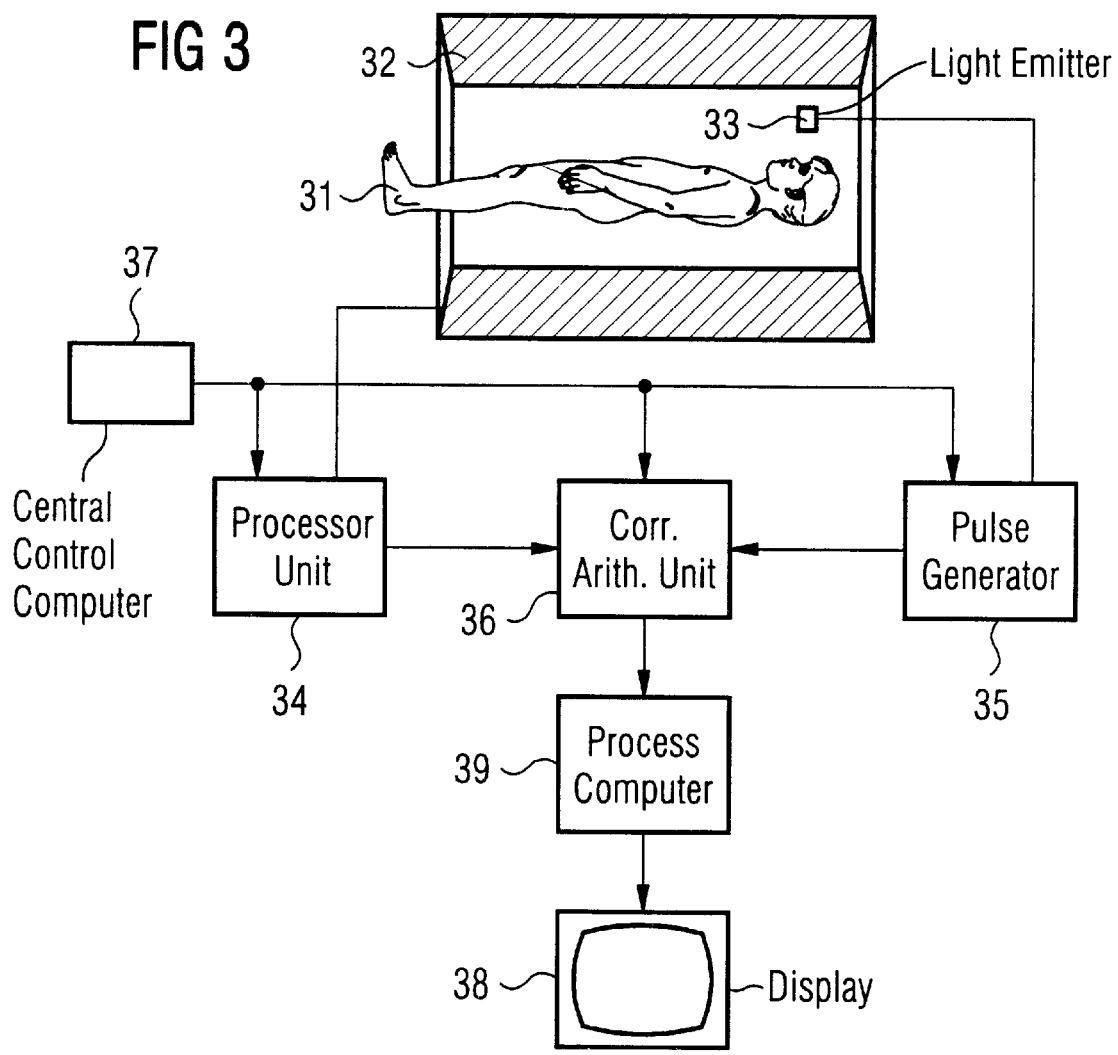
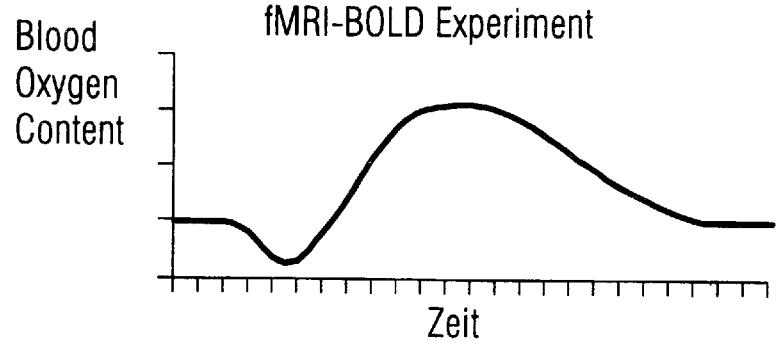

METHOD AND APPARATUS FOR CONDUCTING AN FMRI-BOLD EXPERIMENT WITH MULTIPLE STIMULATION FUNCTIONS

BACKGROUND OF THE INVENTION

1. Field of the Invention

The present invention relates to an apparatus and a method for the time-resolved and location-resolved evaluation of nuclear magnetic resonance signals acquired with the aid of nuclear magnetic resonance in order to detect activity changes in a life form, whereby physiological processes are stimulated in the life form by using at least two stimulation functions.

2. Description of the Prior Art

It has been determined that brain activities caused by stimulation can be detected in the cerebral cortex of human beings with a nuclear magnetic resonance tomography apparatus. A procedure producing and registering such brain activity is known as a stimulation experiment. Such stimulation experiments have been carried out with visual stimulation and with stimulation around the primary motor cortex, for example, by finger movement. Functional brain examinations also can be carried out by different techniques such as PET (positron emission tomography) or EEG. A significantly better topical resolution, however, can be obtained by nuclear magnetic resonance tomography.

An experiment that is typically carried out using nuclear magnetic resonance tomography is known as an BOLD-fMRI experiment. BOLD stands for Blood-Oxygen-Level Dependent (dependent on the oxygen content of the blood). Activity due to a stimulation in a tissue generates a temporary lack of oxygen in the blood surrounding the tissue. The organism detects this lack of oxygen. New oxygen is supplied via the surrounding blood vessels. Given a sudden activity in the tissue, the oxygen content is initially, temporarily, slightly reduced, followed by a long-term-decay overshoot of the oxygen content in the blood as a result of the automatic controller action of the organism. This chronological modification of the local oxygen content in the blood is measured and localized in BOLD-fMRI experiments (fMRI stands for functional magnetic resonance tomography) using a nuclear magnetic resonance tomography apparatus. As an example, FIG. 4 herein shows the chronological course of such a local oxygen concentration in the blood.

Given the acquisition of data in realtime, the time resolution is also limited as a result of the limited pickup speed of the nuclear magnetic resonance technique. Therefore, there are suggestions to trigger the acquisition of data for the functional imaging by stimulations. Only one part of the raw data required for a complete image dataset is acquired per stimulation. Therefore, it has been suggested to synchronize the data acquisition with a periodic repetition of a task triggering brain activities. A similar method has already been used for "film pickups" of the heart movement.

A problem in functional imaging is to separate signal changes of other signal changes arising from stimulations or brain activities—caused by movements, for example. For this purpose, it has also been proposed to calculate a correlation coefficient for each pixel between the stimulation function and the received chronological signal curve. Periodically repeated stimulations that are separated by pauses are used as a stimulation function. Periodic stimulation functions, however, have a number of disadvantages:

Periodic disturbance processes (e.g heartbeat, respiration) cannot be separated from the activity signal and appear as "physiological noise." Processes showing a delay of integral multiples of the repetition period cannot be correctly recognized either. Prolonging this experiment does not lead to a better noise suppression in any of these cases.

Periodic stimulation functions have a nonuniform frequency spectrum. Therefore, specific spectral components are not or only weakly excited by the stimulation. This introduces a systematic error into the system identification, i.e.; the determination of the parameters of a mathematical model.

German Patent 195 29 639 suggests a method for the time-resolved and location-resolved representation of functional brain activities of a patient. A stimulation function stimulates physiological processes in a patient. The stimulation function is nonperiodic and has as a few as possible secondary maxima. On the basis of a pulse sequence for exciting and reading out nuclear magnetic resonance signals, time-resolved and location-resolved nuclear magnetic resonance signals are acquired and are converted into bits of image information. Time-resolved and location-resolved activity modifications in the patient are detected by the chronological correlation of the so acquired bits of information with the stimulation function.

The required MR data must be acquired as fast as possible with respect to the time and location resolution. Fast pulse sequences therefore are primarily used. The fastest currently available MR imaging sequence is referred to as EPI (echo planar imaging) sequence. Other fast pulse sequences such as turbo spin echo sequences, FISP or FLASH sequences are possible as well.

A high-frequency pulse is initially emitted in the EPI sequence. A slice selection gradient is simultaneously generated, so that only one slice of the examination subject is excited, dependent on the frequency spectrum of the high-frequency pulse and on the intensity of the slice selection gradient. A positive sub-pulse of the slice selection gradient is followed by a negative sub-pulse, with which the dephasing caused by the positive sub-pulse is reversed again.

At the same time as the negative sub-pulse of the slice selection gradient, two prephase pulses are emitted in a phase encoding direction or a readout direction.

The readout gradient, with alternating polarity, is subsequently activated. As a result of the alternating sign of the readout gradient, the nuclear magnetic resonance signals are repeatedly rephrased and a signal arises under each sub-pulse of the readout gradient.

The signals are respectively differently phase-encoded because the phase continues to switch from signal to signal by small phase encoding pulses between the signals.

The signals are phase-sensitively demodulated and are digitized in a matrix or grid. The received digital values are entered into a row of a raw data matrix for each signal. In the fastest version of the EPI method, referred to as "single-shot EPI," a sufficient number of signals are acquired after one single excitation in order to prepare a complete raw data set for an image. In a known way, the image can be acquired by two-dimensional Fourier transformation from the raw data matrix.

Not only spatial resolution but also a time resolution of the signals must occur for the functional imaging. For this purpose, the represented sequence is repeated as fast as possible, so that image data, which are allocated to different points in time, are successively received.

The smallest element of an image dataset is referred to as a pixel. A coarser resolution is generally sufficient for the functional imaging compared to conventional nuclear spin tomography images, such as a typical resolution of 256×256 pixels.

FIG. 5 herein shows the schematic process of the known method according to German Patent 195 29 639. The pulse sequence for exciting and reading out nuclear magnetic resonance signals AMR (k) and the stimulation function $f_{S1}$ (k) run independently of one another. Both have an effect on the system 51 comprised of a human being and a magnetic resonance tomograph apparatus, and are clocked by a control computer (not shown); the pulse sequence AMR (k), however, is not triggered by the stimulation function $f_{S1}$ (k). On the basis of the pulse sequence AMR (k), raw data sets SMR (k) are acquired and image data sets B (t), in turn, are acquired from said raw data sets by two-dimensional Fourier transformation 52. A chronological signal curve is received for each element in the raw data matrix SMR (k), or for each pixel in the image data matrix B (t). A cross correlation 54 subsequently ensues between this signal curve SMR (k), or B (t) and the stimulation function $f_{S1}$ (k). The stimulation function $f_{S1}$ (k) was subjected to a suitable delay element 53 having the delay T. It is not significant for the success of the method whether the cross correlation 54 is carried out with the raw data sets SMR (k) or the image data sets B (t), namely whether it is carried out before or after the Fourier transformation 52.

In order to avoid the aforementioned disadvantages, the stimulation function $f_{S1}$ (k) is not allowed to be periodic and must be optimized with respect to the secondary maxima of its auto correlation function. For example, binary codes can be used.

The minimization of secondary maxima in the auto correlation function of such codes is equivalent to a flat performance spectrum and an optimal suppression of interference sources increasing with the length of the function. Additionally, the nonperiodicity can be seen in the minimization of secondary maxima in the auto correlation function. Influences of the stimulation can be extracted from the MR data by a cross correlation of such a stimulation function with the time-dependent function, as it is acquired for each pixel from the MR data. Disturbing processes such as movements (respiration, heartbeat, pulsating CSF) hardly occur during the cross correlation.

The result $P_1$ (T) of the cross correlation 54 can be displayed at a monitor for each pixel. FIG. 6 herein schematically shows the chronological curve of the signal for each pixel. As already been explained in connection with FIG. 5, a connection between the stimulation function and the brain activities caused therewith is created by a correlation analysis. The result of this correlation analysis $P_1$ (T) then can be represented again pixel by pixel at the monitor. Specific brain regions, i.e.; the allocated pixels, can be selected and the result of the correlation analysis can be viewed for this brain region.

SUMMARY OF THE INVENTION

An object of the present invention is to provide a method which allows fMRI experiments to be conducted with a number of parallel stimulation functions, to detect the activity changes in a life form under investigation, the activity changes being based on the number of stimulation functions, and to correctly allocate these to the initiating stimulation functions. Another object of the present invention is to provide a device for implementing the method.

The object is achieved in accordance with a first embodiment of the present invention in a method and an apparatus for the time-resolved and location-resolved representation of functional brain activities of a life form using nuclear magnetic resonance, wherein stimulation of physiological processes in the life form takes place with at least two non-correlating stimulation functions that are orthogonal to one another, and time-resolved and location-resolved nuclear magnetic resonance signals are generated by a pulse sequence for exciting and reading out nuclear magnetic resonance signals, and the generated nuclear magnetic resonance signals are cross-correlated stimulation functions for detecting activity changes in the life form that are based on the respective stimulation function.

Since the (at least) two stimulation functions do not correlate and therefore are oriented perpendicular to one another, it is possible, by means of the following chronological correlation of the nuclear magnetic resonance signals with the stimulation functions, to unambiguously allocate the linear activity change in the life form to a specific stimulation function, this activity change being due to one of the stimulation functions. In order to prevent runtime differences of the signals, the stimulation functions can proceed through suitable delay elements.

The inventive method makes it thus possible to carry out a number of fMRI experiments at the same time, i.e.; a fMRI experiment, wherein physiological processes are stimulated in the life form to be examined with at least two stimulation functions, without a mutual disturbance of the experiments. This saves considerable time and expense in respect to the implementation of the experiments.

In a second embodiment of the invention, physiological processes are stimulated in the life form with at least two non-correlating stimulation functions that are orthogonal to one another, time-resolved and location-resolved nuclear magnetic resonance signals are generated by a pulse sequence for exciting and reading out nuclear magnetic resonance signals, the generated nuclear magnetic resonance signals are correlated with a correlation function that is orthogonal to the stimulation functions, and the correlation function is varied for detecting activity changes in the life form that are based on non-linear coupling of the at least two stimulation functions.

Since the at least two stimulation functions do not correlate and therefore are oriented perpendicular to one another and since the correlation function is also orthogonal to the stimulation functions, it is inventively possible, by means of the chronological correlation of the nuclear magnetic resonance signals with a common correlation function being orthogonal to the stimulation functions, to detect the activity changes of higher order in the life form that are based on a combination of the stimulation functions. The correlation function is not necessarily a single specific function but stems from a family of functions fulfilling the aforementioned condition. Since the linear effects are suppressed during the correlation with the correlation function that is orthogonal to the stimulation functions, a signal received after the correlation can only be due to a nonlinear coupling of two or more stimulation functions. Since the correlation function, which has led to the result, is known a posteriori, it can be concluded a posteriori on which combination of stimulation functions the measured activity change in the life form is based. Moreover, disturb signals such as an unintended movement of the examined life form thus can be extracted. The correlation function can proceed through suitable delay elements here as well in order to eliminate runtime differences of the signals. The inventive method makes it thus possible to detect effects of higher order, i.e.; activity changes in the life form that react to the simultaneous existence of a number of stimuli (stimulation functions) and therefore are based on brain functions (referred to as higher brain functions) that are not accessible by direct stimulation using functional magnetic resonance tomography. A nonlinear coupling of the stimuli means that a brain region only reacts to the simultaneous existence of two stimuli, for example.

In both embodiments the inventive stimulation functions preferably are nonperiodic and have as few secondary maxima as possible in their auto correlation function. Particularly periodic disturbance signals, as a result of the heartbeat or the pulse sequence for exciting or reading out nuclear magnetic resonance signals, can be faded out by the chronological correlation of the signals.

It is in accordance with the invention to use advantageous binary codes as stimulation functions. This is particularly advantageous when the stimulation functions prescribe instructions for actions to be performed by the life form.

The binary codes allow a simple stimulation of the life form (clear signal-effect-relationship, e.g., "Move small finger at light signal"). Functions that are orthogonal to the stimulation functions can also be simply derived in a known way.

In order to exclude interactions between the pulse sequence for exciting and reading out nuclear magnetic resonance signals and the stimulation functions, in an embodiment of the invention, the pulse sequence and the stimulation functions are independent of one another.

In a further embodiment, for detecting a nonlinear coupling of two stimuli, the detection of activity changes in the life form based on nonlinear coupling of the (at least) two stimulation functions is carried out using statistic methods. The result of the cross-correlation is thereby evaluated using suitable statistic methods such as the "higher order statistics," for example. These methods are particularly suitable for detecting and evaluating nonlinear terms in a signal.

The correlation function plays a significant role for detecting a nonlinear coupling of two stimuli. In an embodiment of the invention the correlation function is varied using a shift register. By using a shift register, a suitable family of functions can be produced, which are all perpendicular relative to the individual stimulation functions.

DESCRIPTION OF THE DRAWINGS

FIG. 1 is a Flowchart showing a first exemplary embodiment of the inventive method, which makes it possible to carry out a number of fMRI experiments at the same time.

FIG. 2 is a Flowchart showing a second exemplary embodiment of the inventive method, which makes it possible to localize higher brain functions.

FIG. 3 schematically shows an MR apparatus for functional imaging, operable in accordance with the inventive method.

FIG. 4 shows the curve of the oxygen content of the blood in the surrounding tissue given a sudden activity in the tissue.

DESCRIPTION OF THE PREFERRED EMBODIMENTS

Figure 5:
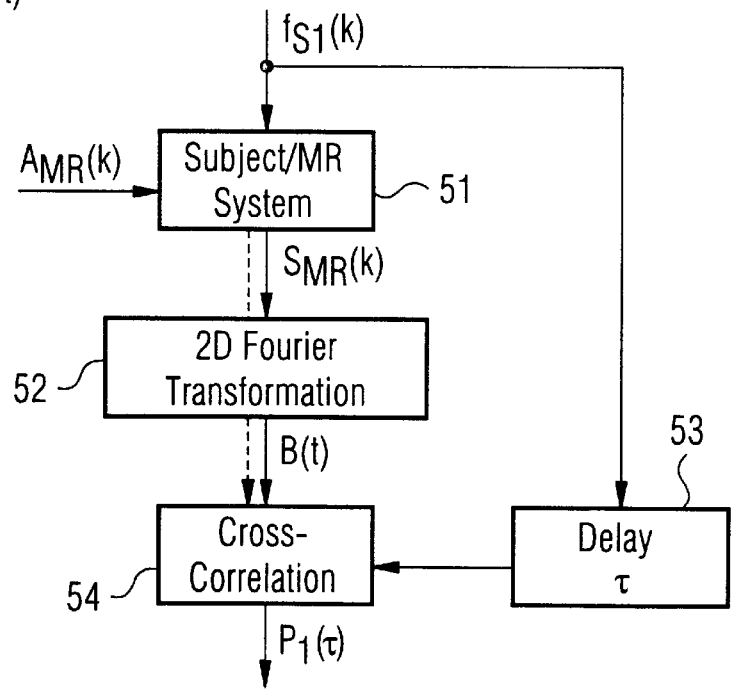
FIG. 5, as discussed above, is a Flowchart showing a method for the time-resolved and location-resolved representation of functional brain activities of a patient according to the prior art.
Figure 6:
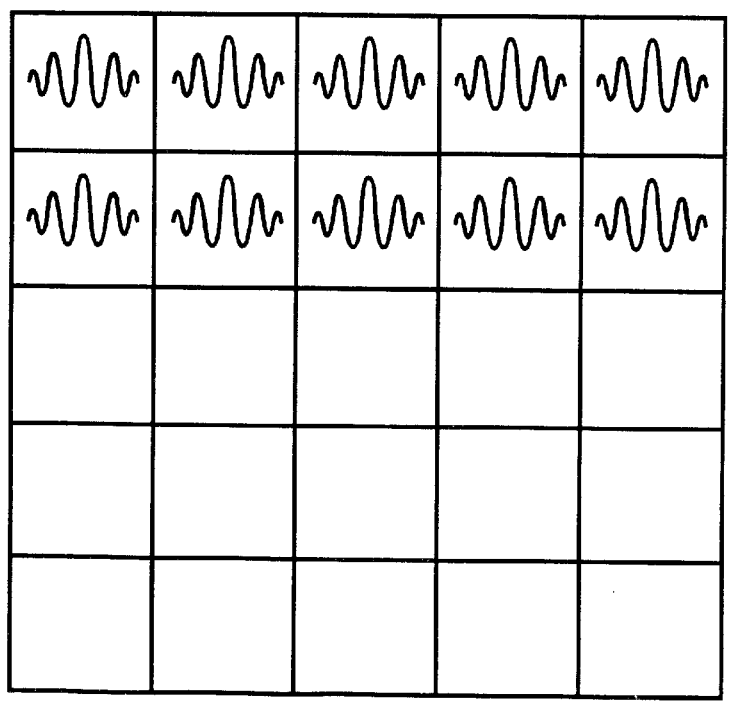
FIG. 6 schematically shows the signal curve in individual pixels.

The general structure of an fMRI experiment, with which the present invention can be realized, is briefly outlined in the following.

As schematically shown in FIG. 3, a patient 31 is introduced into a magnet 32, which generates a basic magnetic field and which has built-in structures (not shown for simplicity) for generating magnetic gradient fields and a high-frequency antenna for transmitting and receiving high-frequency pulses. The gradient coils and the high-frequency antenna are connected to a processor unit 34. The function of the MR apparatus is assumed as known, since the structure essentially corresponds to conventional apparatuses.

A pulse generator 35 generates a stimulation function, with which a light transmitter 33, for example, is driven. For example, an electric stimulation also can ensue or the patient can be caused—by optical signals, for example—to carry out movements corresponding to the stimulation function. The MR data acquired by the processor unit 34 and the stimulation function generated in the pulse generator 35 are correlated with one another in a correlation arithmetic unit 36. The thus-acquired data can be further edited in a process computer 39 and can be displayed at a monitor 38. The output signal of the magnetic resonance data acquisition system, in a known way, is transformed into an image signal by a two-dimensional Fourier transformation.

The processor unit 34, the correlation arithmetic unit 36 and the pulse generator 35 are controlled by a central control computer 37.

Using this apparatus, fMRI experiments can be conducted, wherein physiological processes are stimulated in the patient/life form with the aid of stimulation functions and wherein activity changes as a result of the stimulation functions are detected in the patient/life form.

FIG. 1 schematically shows the process of the inventive method with respect to the parallel, simultaneous implementation of a number of fMRI experiments without mutual interference.

In order to stimulate physiological processes in a patient, the system 11 formed by the human being/MR apparatus is excited by two non-correlating stimulation functions $f_{S1}(t)$, $f_{S2}(t)$, which are orthogonal to one another. Nuclear magnetic resonance signals SMR (t) are received (after internal processing steps that are not shown in greater detail) at the output of the system 11. These nuclear magnetic resonance signals SMR (t) are respectively, chronologically correlated in two separate cross correlations 14, 15 with respectively one of the stimulation functions $f_{S1}(t)$, $f_{S2}(t)$. In order to compensate system-produced runtime differences, the stimulation functions $f_{S1}(t)$, $f_{S2}(t)$ initially proceed through appropriate delay circuits 12, 13 having delays $T_1$, $T_2$. The signals $P_1(T_1)$, $P_2(T_2)$ occurring at the output of the two cross correlations 14, 15 indicate the activity changes in the human being/patient, the activity change being based on the respective stimulus, i.e., the respective stimulation function $f_{S1}(t)$, $f_{S2}(t)$.

Since the two stimulation functions $f_{S1}(t)$, $f_{S2}(t)$ do not correlate and therefore reside perpendicular on one another, it is possible, by means of the chronological correlation of the nuclear magnetic resonance signals SMR (t) with the stimulation functions $f_{S1}(t)$, $f_{S2}(t)$, to unambiguously allocate the linear activity change in the human being/patient, which is based on one of the stimulation functions $f_{S1}(t)$, $f_{S2}(t)$, to a specific stimulation function $f_{S1}(t)$, $f_{S2}(t)$. The inventive method makes it thus possible two carry out two fMRI experiments at the same time without mutual interference. In contrast to the prior art, the invention makes it possible to save considerable time with regard to the implementation of the experiments and to save costs.

The inventive method can be executed by a device as shown in FIG. 3. The system 11 thereby corresponds to a combination of patient 31, a magnet 32, and a processor unit 34. The stimulation functions $f_{S1}$ (t), $f_{S2}$ (t) can excite the system 11 with the pulse generator 35 and one or more light transmitters 33. The cross correlation 14, 15 of the nuclear magnetic resonance signals SMR (t) with the stimulation functions $f_{S1}$ (t), $f_{S2}$(t) occurs in the correlation arithmetic unit 36. The delay circuit 12, 13 can be realized in the pulse generator 35. After a Fourier transformation in the process computer 39, for example, the thus-acquired data can be displayed at a monitor 38. The process unit 34, the correlation arithmetic unit 36 and the pulse generator 35 are controlled by a central control computer 37.

FIG. 2 schematically shows the process of the inventive method allowing the detection of higher activity changes in a patient, i.e., an activity change that only reacts to the simultaneous existence of a number of stimuli, by nuclear magnetic resonance.

In order to stimulate physiological processes in a patient, the system 21 formed by a human being/MR apparatus is excited by a number of non-correlating stimulation functions $f_{S1}$ (t), $f_{S2}$ (t), $f_{Sn}$ (t), which are orthogonal to one another. The inventively used stimulation functions $f_{S1}$ (t), $f_{S2}$ (t), $f_{Sn}$ (t) are nonperiodic and have as few as possible secondary maxima in their auto correlation. In this exemplary embodiment, binary codes are utilized as stimulation functions. Nuclear magnetic resonance signals SMR (t) are received at the output of the system 21 formed by the patient and a magnetic resonance tomograph apparatus. These nuclear magnetic resonance signals SMR (t) are correlated in a cross correlation 23 with a correlation function $f_{orth}$ (t) that is orthogonal to each of the stimulation functions $f_{S1}$ (t), $f_{S2}$ (t), $f_{Sn}$ (t). In order to eliminate runtime differences of the signals, the correlation function $f_{orth}$ (t) proceeds through a suitable delay element 22 with the delay T. The correlation function $f_{orth}$ (t) is an arbitrary function from the family of the functions that are orthogonal to the individual stimulation functions $f_{S1}$ (t), $f_{S2}$ (t), $f_{Sn}$ (t), and is determined by known mathematical methods. In "Advanced Methods of Physiological System Modeling" (vol. III, ed. V. Z Marmarelis; New York, Plenum, pp. 87–110; 1994), Ethan A. Benardete and Jonathan D. Victor describe an approach for determining similar functions in the publication "An extension of the m-sequence technique for the analysis of multi-input nonlinear systems." A family of suitable functions, however, can be derived in a different way. The family of the suitable correlation functions $f_{orth}$ (t) can be proceeded through a shift register, for example, and the correlation function $f_{orth}$ (t) can be varied in this way.

Since at least two stimulation functions $f_{S1}$ (t), $f_{S2}$(t), $f_{Sn}$ (t) do not correlate and therefore reside perpendicular on one another, and since the correlation function $f_{orth}$ (t) is orthogonal to each of the stimulation functions $f_{S1}$ (t), $f_{S2}$(t), $f_{Sn}$ (t), a signal P (T) reproducing the activity changes of higher order in the system 21 (the activity changes being based on a combination of the stimulation functions $f_{S1}$ (t), $f_{S2}$(t), $f_{Sn}$ (t) is inventively obtained by the chronological correlation of the nuclear magnetic resonance signals SMR (t) with one of the correlation functions $f_{orth}$ (t) at the output of the cross correlation 23. Since the linear effects are suppressed during the correlation 23 with the correlation function $f_{orth}$ (t) that is orthogonal to the stimulation functions $f_{S1}$ (t), $f_{S2}$(t), $f_{Sn}$ (t), the resulting signal P (T) can be based only on a nonlinear coupling of two or more stimulation functions $f_{S1}$ (t), $f_{S2}$(t), $f_{Sn}$ (t).

Upon consideration of the chronological process of the stimulation functions $f_{S1}$ (t), $f_{S2}$(t), $f_{Sn}$ (t) and the correlation function $f_{orth}$ (t), which produce the signal P (T) and which is known a posteriori, it can be concluded a posteriori on which combination of stimulation functions $f_{S1}$ (t), $f_{S2}$(t), $f_{Sn}$ (t) the measured activity change in the human being/patient is based. The inventive method thus makes it possible to detect effects of higher order, i.e. effects reacting to the simultaneous existence of a number of stimuli. This is referred to as a nonlinear coupling of stimuli.

In the present exemplary embodiment, the nonlinear terms contained in the output signal P (T) of the cross correlation 23 are further examined by statistical methods 24 (HOS=higher order statistics). This method for evaluating nonlinear terms in a signal is known, for example, from the publications "Introducing higher order statistics (HOS) for the detection of nonlinearities" (UK Nonlinear News, September 1995), "Nonlinearity detection for condition monitoring using higher-order statistics" and "The higher-order statistic of speech signals" (presented at the IEEE Colloquium on "Techniques for Speech Signal Processing and theit [sic] applications," London, Jun. 1, 1994; Digest No. 1994/138 p7/1–7/6). The primary authors of these three articles are J. W. A Fackrell and S. McLaughlin.

In order to facilitate the evaluation of the experiment, it is advantageous when the result of the cross correlation is represented as a cross correlation image. This can ensue in a known way by a two-dimensional Fourier transformation of the signal received at the output of the cross correlation. This type of representation considerably increases the graphicness of the acquired data and allows a fast and precise evaluation of the result.

This embodiment of the inventive method also can be executed by the device according to FIG. 3. The system 21 thereby corresponds to a combination of the patient 31, the magnet 32 and the processor unit 34. The stimulation functions $f_{S1}$ (t), $f_{S2}$ (t), $f_{Sn}$ (t) can excite the system 21 with the pulse generator 35 and one or more light transmitters 33. Acoustic, thermal and/or driving transmitters 33 can be used as well. The cross correlation 23 of the nuclear magnetic resonance signals SMR (t) with the correlation functions $f_{orth}$ (t) occurs in the correlation arithmetic unit 36. The correlation function $f_{orth}$ (t) is derived and varied in the processor unit 34 (or the central control computer 37). The delay circuit 22 is realized in the pulse generator 35 (or alternatively in the correlation arithmetic unit 36). Before or after a Fourier transformation in the process computer 39, the signal P (T) acquired in the cross correlation 23 is further edited in the process computer 39 with statistic methods before the data are displayed at a monitor 38. The process unit 34, the correlation arithmetic unit 36 and the pulse generator 35 are also controlled here by a central control computer 37. The central control computer 37 certainly control the process computer 39 as well.

On the basis of the inventive methods and devices described herein, it is possible to carry out fMRI experiments with a number of parallel stimulation functions, to detect activity changes in the relevant life form, these activity changes being based on a number of stimulation functions, and to correctly allocate them to the triggering stimulation functions.

The inventive methods and devices make it possible to simultaneously carry out a number of individual fMRI experiments and to detect as higher brain functions, i.e., brain functions that are not accessible by direct stimulation.

Although other modifications and changes may be suggested by those skilled in the art, it is the intention of the inventor to embody within the patent warranted hereon all changes and modifications as reasonably and properly come within the scope of their contribution to the art.

I claim as my invention:

1. A method for time-resolved and location-resolved representation of functional brain activities of a living subject by nuclear magnetic resonance, comprising the steps:

stimulating physiological processes in a living subject with at least two non-correlating stimulation functions which are orthogonal to one another;

subjecting said living subject to a pulse sequence for exciting nuclear magnetic resonance signals in, and for reading said nuclear magnetic resonance signals from, said living subject to generate time-resolved and location-resolved nuclear magnetic resonance signals;

cross correlating said nuclear magnetic resonance signals with a correlation function that is orthogonal to said stimulation functions; and varying said correlation function to detect activity changes in said living subject which arise due to non-linear coupling of said at least two non-correlating stimulation functions.

2. A method as claimed in claim 1, comprising employing stimulation functions, as said at least two non-correlating stimulation functions, which are nonperiodic and which have a minimum of secondary maxima in their auto correlation function.

3. A method as claimed in claim 1, comprising employing binary codes as said at least two non-correlating stimulation functions.

4. A method as claimed in claim 1, comprising employing stimulation functions, as said at least two non-correlating stimulation functions, which prescribe instructions for respective actions by said living subject.

5. A method as claimed in claim 1, comprising detecting said activity changes in said living subject using statistical methods.

6. A method as claimed in claim 1, wherein the step of varying said correlation function comprises varying said correlation function using a shift register.

7. A method as claimed in claim 1, comprising employing a pulse sequence for exciting and reading out said nuclear magnetic resonance signals which is independent of said stimulation functions.

8. A method for time-resolved and location-resolved representation of functional brain activities of a living subject by nuclear magnetic resonance, comprising the steps:

stimulating physiological processes in a living subject with at least two non-correlating stimulation functions which are orthogonal to one another;

subjecting said living subject to a pulse sequence for exciting nuclear magnetic resonance signals in, and for reading said nuclear magnetic resonance signals from, said living subject to generate time-resolved and location-resolved nuclear magnetic resonance signals; and cross correlating said nuclear magnetic resonance signals with said stimulation functions to detect activity changes in said living subject which are based on the respective stimulation functions.

9. A method as claimed in claim 8, comprising employing stimulation functions, as said at least two non-correlating stimulation functions, which are nonperiodic and which have a minimum of secondary maxima in their auto correlation function.

10. A method as claimed in claim 8, comprising employing binary codes as said at least two non-correlating stimulation functions.

11. A method as claimed in claim 8, comprising employing stimulation functions, as said at least two non-correlating stimulation functions, which prescribe instructions for respective actions by said living subject.

12. A method as claimed in claim 8, comprising employing a pulse sequence for exciting and reading out said nuclear magnetic resonance signals which is independent of said stimulation functions.

13. An apparatus for time-resolved and location-resolved representation of functional brain activities of a living subject by nuclear magnetic resonance, comprising:

a function generator which produces at least two non-correlating stimulation functions which are orthogonal to one another;

said stimulation functions being adapted for stimulating physiological processes in a living subject;

a magnetic resonance apparatus for obtaining time-resolved and location-resolved nuclear magnetic resonance signals from the living subject while the living subject is being stimulated by said stimulation functions;

a correlation arithmetic unit, supplied with said nuclear magnetic resonance signals, for cross-correlating said nuclear magnetic resonance signals with a correlation function that is orthogonal to the respective stimulation functions, to produce an output; a control unit connected to said correlation arithmetic unit for varying said correlation function; and an evaluation unit supplied with said output from said correlation arithmetic unit for detecting activity changes in the living subject which are based on non-linear coupling of said at least two stimulation functions.

14. A device as claimed in claim 13, wherein said function generator generates stimulation functions which are nonperiodic and which have a minimum of secondary maxima in their auto correlation function.

15. An apparatus as claimed in claim 13, wherein said function generator generates binary codes as said stimulation functions.

16. An apparatus as claimed in claim 13, wherein the function generator generates stimulation functions which prescribe instructions for actions by said living subject.

17. An apparatus as claimed in claim 13, wherein said evaluation device employs statistical methods to detect said activity changes.

18. An apparatus as claimed in claim 13, wherein said evaluation device and said correlation arithmetic unit comprise a process computer for said magnetic resonance apparatus.

19. An apparatus as claimed in claim 13, wherein said evaluation device and said correlation arithmetic unit comprise a personal computer.

20. An apparatus as claimed in claim 13, wherein said function generator generates stimulation functions, as said at least two non-correlating stimulation functions, which are independent of said pulse sequence.

21. An apparatus for time-resolved and location-resolved representation of functional brain activities of a living subject by nuclear magnetic resonance, comprising:

a function generator for generating at least two non-correlating stimulation functions which are orthogonal to one another, said stimulation functions being adapted for respectively stimulating physiological processes in a living subject;

a magnetic resonance apparatus for generating time-resolved and location-resolved nuclear magnetic resonance signals from the living subject while said living subject is being stimulated by said stimulation functions;

a correlation arithmetic unit supplied with said nuclear magnetic resonance signals and said stimulation functions for cross-correlating said nuclear magnetic resonance signals with said stimulation functions, to produce an output; and an evaluation unit supplied with said output from said correlating arithmetic unit for detecting activity changes in said living subject which are based on the respective stimulation functions.

22. A device as claimed in claim 21, wherein said function generator generates stimulation functions which are nonperiodic and which have a minimum of secondary maxima in their auto correlation function.

23. An apparatus as claimed in claim 21, wherein said function generator generates binary codes as said stimulation functions.

24. An apparatus as claimed in claim 21, wherein said function generator generates stimulation functions which prescribe instructions for actions by the living subject.

25. An apparatus as claimed in claim 21, wherein said function generator generates stimulation functions, as said at least two non-correlating stimulation functions, which are independent of said pulse sequence.

* * * * *